United States Patent [19]
Miller

[11] Patent Number: 4,644,325
[45] Date of Patent: Feb. 17, 1987

[54] LOW VOLTAGE, SINGLE POWER SUPPLY OPERATED DIGITAL ANALOG CONVERTER

[75] Inventor: Ira Miller, Tempe, Ariz.

[73] Assignee: Motorola, Inc., Schaumburg, Ill.

[21] Appl. No.: 789,604

[22] Filed: Oct. 21, 1985

[51] Int. Cl.$^4$ .............................................. H03M 1/68
[52] U.S. Cl. ........................................... 340/347 DA
[58] Field of Search ................. 340/347 DA, 347 AD

[56] References Cited

U.S. PATENT DOCUMENTS

| | | | |
|---|---|---|---|
| 3,474,440 | 10/1969 | Schmid | 340/347 DA |
| 4,292,625 | 9/1981 | Schoeff | 340/347 DA |
| 4,338,592 | 7/1982 | Wilensky | 340/347 DA |
| 4,492,954 | 1/1985 | Harris | 340/347 DA |
| 4,539,552 | 9/1985 | Davis | 340/347 DA |

OTHER PUBLICATIONS

McGlinchey "IEEE International Solid–State Circuits Conference Digest of Technical Papers", Feb. 10, 1982, pp. 80–81 and 296–297.

*Primary Examiner*—Charles D. Miller
*Attorney, Agent, or Firm*—Michael D. Bingham

[57] ABSTRACT

A digital to analog converter circuit includes a current supply for providing a plurality of output currents of substantially equal magnitudes, a subtractor circuit coupled with selective outputs of the current supply for producing a plurality of binary weighted output currents and a summing circuit which is responsive to a binary coded digital input signal for selectively summing the binary weighted output currents and the remaining equal magnitude currents to provide a representative analog output current. The converter circuit is suited to be operated from a single source of power supply and does not require resistor trimming.

15 Claims, 6 Drawing Figures

```
00100000 = I₁
00100001 = I₁+LSB
00100010
00100011
00100100
00100101
00100110
00100111
00101000
00101001
00101010
00101011
00101100
00101101
00101110
00101111
00110000
00110001
00110010
00110011
00110100
00110101
00110110
00110111
00111000
00111001
00111010
00111011
00111100
00111101
00111110
00111111 = I₂-LSB
01000000 = I₂
```

LOW VOLTAGE, SINGLE POWER SUPPLY OPERATED DIGITAL ANALOG CONVERTER

BACKGROUND OF THE INVENTION

The present invention relates to converter circuits and, more particularly, to digital-to-analog convertors (DAC's) suited to be manufactured in monolithic integrated circuit form and operated from a single source of power supply. The prior art is replete with DAC's of the type to which the present invention is related. A typical prior art DAC includes circuitry for generating a reference current, a binary weighted R2R resistive ladder network and switching circuitry responsive to a binary digital input signal code for switching current to the ladder network thereby producing a corresponding analog output current. For instance, the MC1408, which is manufactured by Motorola, Inc., is an 8-bit DAC of this type.

Prior art DAC's have required trimmable resistors for obtaining precise values. Trimming is commonly implemented by using thin film resistors which are laser trimmed. The thin film resistors are typically implemented by putting a thin film layer over a thick field oxide layer. Laser trimming is generally restricted to thin film processing which must be implemented before packaging at a wafer probe stage. If the die is stressed during or after packaging, the value of the resistors may change. Thus, resistor trimming is not desirable.

Other prior art DAC's, in order to eliminate the need for trimmable resistors, utilize a segmented approach. In this approach, a plurality of equal weighted or equal magnitude currents are produced corresponding to a step group. An additional current step of equal magnitude is used in conjunction with a nine bit master/slave DAC to produce a step group having 512 individual current steps. As a step group is generated by stepping through each of the individual 512 current steps, an individual one of the equal weighted currents is sourced to the output of the DAC. Thus, for example, as the binary digital input signal code increases from a minimum to the first second segment or current step, 512 individual current steps are selected. Thereafter, the first current step group is held while the nine-bit DAC steps once again through these 512 levels in response to the next higher digital input signal code. The currents are summed through a summing network to the output of the DAC.

Although the aforedescribed segment DAC approach eliminates the need for trimmable resistors it does require dual power supplies for operation. Thus, it is not suited for operation in conjunction with single, low voltage power supply systems such as five (5) volt microprocessor applications.

Hence, a need exists for a single power supply, low voltage operated DAC which does not require the use of trimmable resistors for accuracy and in which the operation is inherently monotonic.

SUMMARY OF THE INVENTION

Accordingly, it is an object of the present invention to provide an improved digital-to-analog converter (DAC) circuit.

It is another object of the present invention to provide a low voltage single power supply DAC.

Still another object of the present invention is to provide an improved integrated DAC circuit which is operated from a single power supply and which does not require trimmable resistors.

Yet another object of the present invention is to provide a single power supply operated DAC which is inherently monotonic.

In accordance with the above and other objects there is provided an improved integrated digital-to-analog converter (DAC) circuit that is operated from a single power supply source coupled across first and second power supply conductors of the DAC and which includes a current supply circuit for generating a plurality of equal weighted as well as binary weighted currents which is comprised of resistors the values of which need not be trimmable.

DETAILED DESCRIPTION OF THE PREFERRED EMBODIMENT

Figure 1:
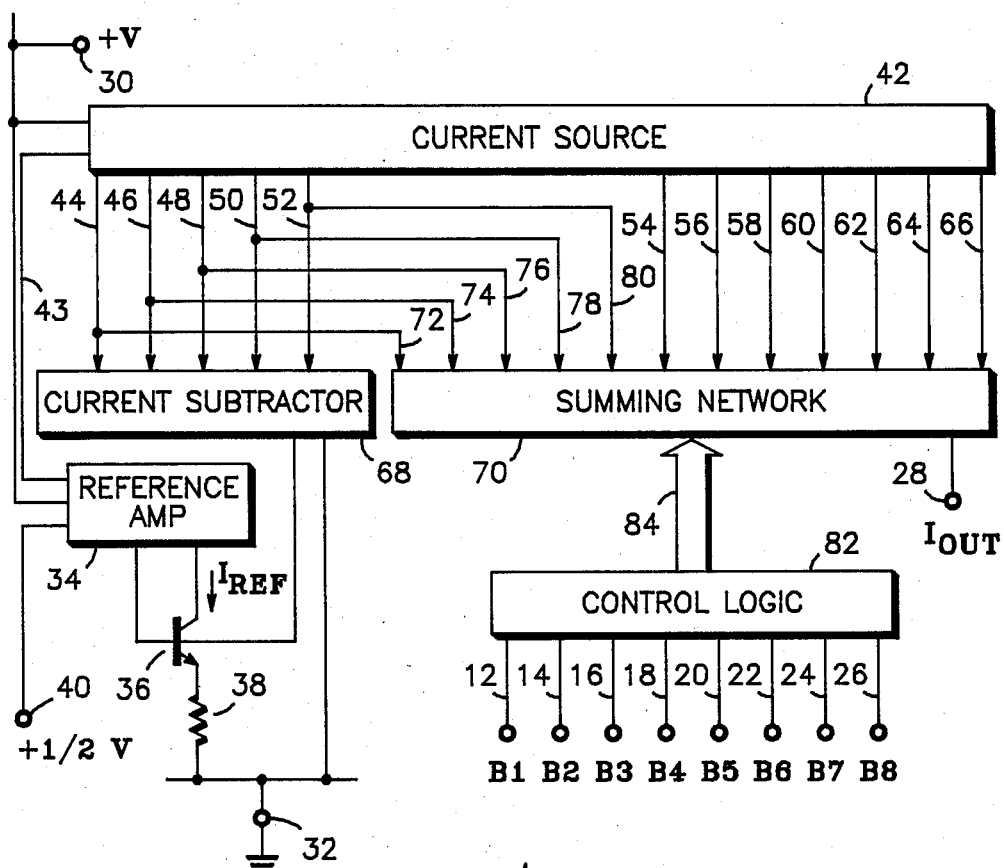
FIG. 1 is a block diagram illustrating the digital-to-analog convertor (DAC) of the preferred embodiment.

Turning to FIG. 1 there is illustrated digital-to-analog converter (DAC) 10 of the present invention which is suited to be manufactured in integrated circuit form utilizing conventional bipolar integrated circuit process technology. For purposes of description, DAC 10 is illustrated as being an eight bit DAC, i.e., in response to an 8 bit binary digital signal (B1–B8) supplied at inputs 12 through 26. A corresponding analog output current $I_{OUT}$ is produced at output 28. It is understood, however, that any desired binary number, for instance, a twelve bit binary number can be converted to a corresponding analog output signal utilizing the principles of the present invention.

A significant feature of the present invention, which will be described in detail hereinafter, is that DAC 10 is operated from a single, low voltage power supply coupled thereto across terminals 30 and 32 at respective first and second power supply conductors of DAC 10. The power supply potential V+ may, for instance, be five volts or less so that DAC 10 can be operated in conjunction with standard microprocessor systems.

As illustrated, DAC 10 comprises reference amplifier 34 in conjunction with reference transistor 36 and resistor 38 which provide a reference current I REF of predetermined value. Thus, responsive to a bias potential which may be substantially equal to one-half V+ supplied at input 40, reference amplifier 34 provides sufficient base current drive to transistor 36 which in turn cause the latter to conduct the current $I_{REF}$ which corresponds to a current segment step as will be described. Transistor 36, having its collector-emitter path coupled between current source means 42 an ground reference via lead 43 causes the latter to produce a plurality of substantially constant and equal weighted currents at outputs 44 through 66. The currents produced from current source means 42 are all substantially equal in magnitude to the value of IREF. For instance, if IREF is equal to 32 microamperes, each of the currents sourced at the outputs of current source means 42 will also be equal to 32 microamperes. Selected outputs 44, 46, 48, 50 and 52 of current source means 42 are connected to current subtractor circuit 68 with the remaining outputs 54 through 66 being connected to summing network 70, the output at which IOUT is produced. Current subtractor 68 sinks proportional amounts of each of the current source thereto from current source means 42 to produce a plurality of binary decremented weighted currents that are sourced, via leads 72 through 80, to summing network 70. The combination of current source means 42 and current subtractor circuit 68 provides a current supply means for sourcing both equal weighted and binary weighted currents to summing network 70. Control logic circuit 82 is responsive to the applied binary digital signal supplied thereto for switching currents supplied to summing network 70 accordingly to derive the corresponding or representative analog output current IOUT at output 28. The correct control signals for switching currents that are summed at output 28 are applied over bus 84.

Figure 2:
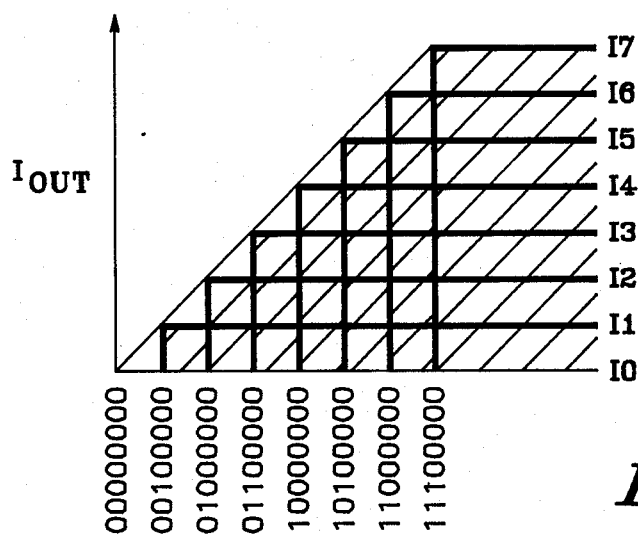
FIG. 2 is a graph illustrating the transfer characteristics of the DAC of FIG. 1.

Referring now to FIG. 2, each of the individual current segments supplied from current source 42, via leads 54 through 66, directly to summing network 70 corresponds to a unit current segment step I1 through I7 respectively. The binary decremented currents sourced to summing network 70 via lead 72 to 80, represent fine current steps. Thus, if IREF equals 32 microamperes, each segment current segment step equals the next, i.e., I1=I2=I3=I4=I5=I6=I7 with each being equal to 32 microamperes. The fine currents source via leads 72 through 80 are binary related to each other and are equal to IREF/2, IREF/4, IREF/8, IREF/16, and IREF/32, respectively.

Figures 4, 6:
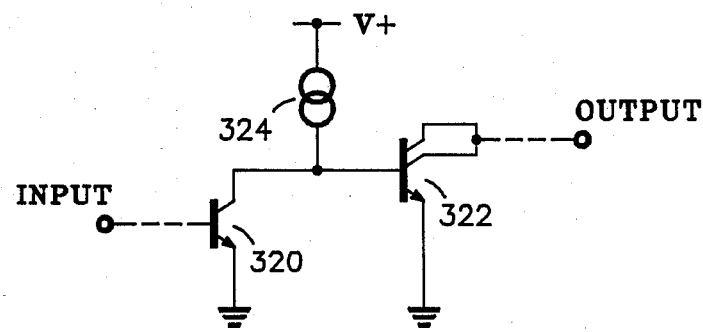
FIG. 4 illustrates a truth table of the applied digital input signal code between two segment current levels.
FIG. 6 is a schematic diagram illustrating a typical integrated injection logic gate of the decode circuit of FIG. 5.

Briefly, between each current segment step, each fine current step is stepped through by the next increase in the applied digital input signal such that each segment current step is turned on and summed at output 28 to provide IOUT only after each fine current step has been turned on. This ensures that the operation of DAC 10 is monotonic without requiring the use of a resistor network as well as resistor trimming. The operation of DAC 10 may be visualized by assuming an input binary signal code wherein all bits are equal to zero, as shown in FIG. 4. This binary input code produces an IOUT current equal to zero. As the input binary signal code increases, a first fine current step, IREF/32, is sourced to summing network 70 to produce a corresponding IOUT. Individual switching circuits connected via bus 84 are controlled in response to the binary code input signal to switch all other currents to ground. As the input code increases by one, the next or second fine current, IREF/16, is summed through summing network 70 with the first fine current step. This action continues until all of the fine currents are summed through summing network 70 to produce an IOUT equal to 31×IREF/32. The next increase in the binary digital input signal will cause control logic circuit 82 to switch all of the fine currents to ground while simultaneously switching the current segment step I1 through summing network 70 to output 28 to produce a current IOUT equal to the value of IREF. Thus, between each current segment current step, 32 fine current steps are required. This action ensures that monotonicity of DAC 10 is obtained.

Figure 3:
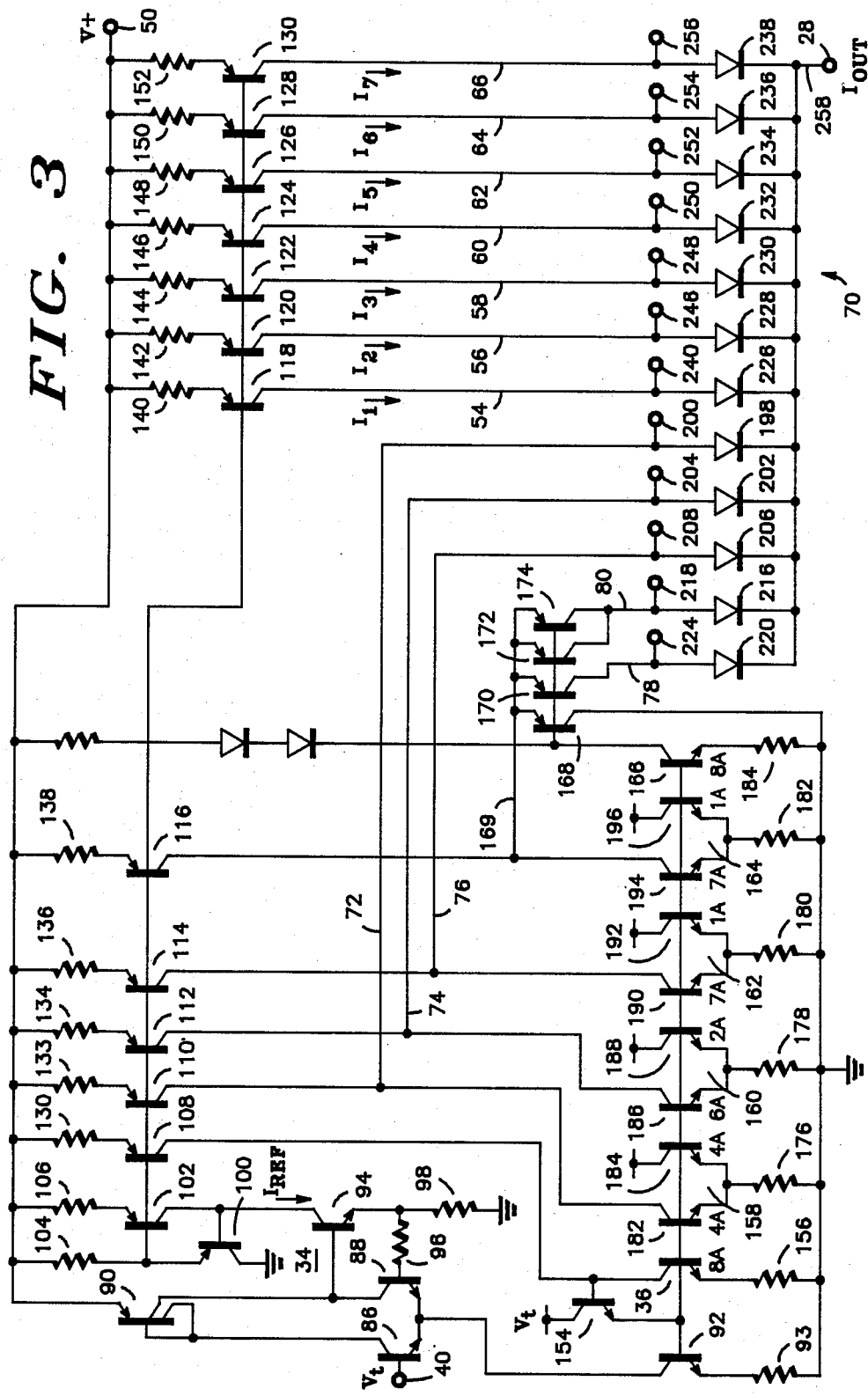
FIG. 3 is a detailed schematic diagram illustrating the DAC of FIG. 1.

Turning now to FIGS. 3 and 4, in conjunction with FIG. 2, the detailed operation of DAC 10 is explained. It is understood that elements in the figures corresponding to elements in FIG. 1 are referenced by the same reference numerals. Reference amplifier 34 comprises an operational amplifier including differentially connected transistors 86 and 88 the collectors of which are coupled to multiple collector current source transistor 90. The emitters of transistors 86 and 88 are connected in the collector-emitter path of transistor 92 which is returned to ground reference via resistor 93. In response to the bias potential supplied at input 40 to the base of transistor 86, current is sourced from V+ through the emitter-collectors of transistor 90 to supply currents to transistors 86 and 88. Transistor 94 provides feedback between the collector and base of transistor 88 via resistor 96 such that a voltage is established at the junction of resistors 96 and 98, at the emitter of transistor 94, to supply a bias potential at the base of transistor 88 that is maintain substantially equal to the voltage supplied to input 40. Thus, a substantially constant current IREF is produced through the current mirror comprising transistors 100 and 102 and resistors 104 and 106 that is sourced to the collector of transistor 94. This current mirror establishes a substantially constant bias potential at interconnected bases of the plurality of PNP transistors 108 through 130. Hence, a current equal to IREF is produced at the collectors of these transistors, assuming that the transistors are matched and emitter degeneration resistors 133 through 152 are equal to each other as well as to resistors 104 and 106. Transistor 154 eliminates base current errors that otherwise occur due to the base current required to drive transistor 36 and 92. Reference transistor 36, which sources a current equal to IREF, has its collector-emitter path coupled to ground via resistor 156 which establishes a second bias potential that is supplied to subtractor circuit 68.

Current subtractor 68 includes a plurality of differentially connected transistor pairs 158, 160, 162, 164 and individual transistors 166, 168, 170, 172 and 174. Each of the bases of the individual transistors of each transistor pair as well as the base of transistor 166 are interconnected to the bases of transistors 92 and 36 to ensure that each individual transistor of a particular differential pair is biased at the same bias potential as the other transistors and therefore that they all conduct equally. The differentially connected emitters of the respective differential pairs are returned to ground via emitter resistors 176, 178, 180 and 182. Similarly, the emitter of transistor 166 is also returned to ground through resistor 184. By scaling the emitter areas of the respective transistors of each transistor pair, as well as transistor 166, with respect to reference transistor 36, binary decremented currents are produced which are source via leads 72 through 80 to summing network 70. As illustrated, the emitter area of transistor 36 is made equal to eight unit areas, 8A, such that a unit current of four microamperes is realized for each unit emitter area (assuming that IREF is equal to 32 microamperes). Each transistor 182 and 184 of transistor pair 158 has an emitter of four unit areas, 4A, one half the size of reference transistor 36. Thus, each of the transistors 182 and 184 will sink a current of four units or approximately 16 microamperes. Since transistor 110 sources a current of 32 microamperes, 16 microamperes of which are conducted via transistor 182 an excess of 16 microamperes is sourced via lead 72 to diode 198 of summing network 70 at node 200. Similarly, the emitters of transistors 186 and 188 are area ratioed with respect to each other with transistor 186 having an emitter area of 6 units and transistor 188 an emitter area of 2 units. Similarly the emitters of transistors 190, 192 and 194, 196 have emitter areas equal to seven and one units respectively. Thus, a current of eight microamperes is sourced via lead 74 to diode 202 at node 204, and a current of four microamperes is sourced via lead 76 to diode 206 at node 208. The excess binary weighted current sourced from transistor 116 to the circuit comprising transistors 168, 170, 172 and 174 is further decremented to provide a binary pair of currents that are sourced to diodes 216 and 220 at nodes 218 and 224 respectively. Since, transistors 168 through 174 are matched, the current sourced to their respective emitters is equally divided so that one fourth of the excess current supplied through lead 169 is sourced from each of the collectors. Transistor 166, functions as a current source to provide base current drive for these transistors. Therefore, with a current equal to a IREF/8 flowing through lead 169, each transistor 168 through 174 sources a current equal to IREF/32 from its collector. With the collectors of transistors 172 and 174 being connected together, a current is sourced to node 218 which is twice the value of the current source from the collector of transistor 170 to node 224. Thus, the currents representing the five fine current are binarily weighted with respect to each other. Each of the transistors 118 through 128 produce equal weighted course segment currents, each equal to IREF, which are sourced to diodes 226 through 238 of summing network 70 at nodes 243-256 respectively. Each of the nodes 200 through 218 and 240 through 256 are connected to a respective output of control logic circuit 82 whereby the individual currents sourced to these nodes are either summed through the individual diodes to lead 258 thereby producing $I_{OUT}$ or are switched to ground reference through control logic circuit 82 depending upon the particular code of the binary digital input signal. For example, with the input binary number supplied at inputs 12-26 being equal to all zeroes, all of the currents supplied to summing network 70 are sourced to ground through the control logic circuit 82 whereby the current IOUT is equal to zero. Similarly, with the input bits, B6, B7, B8 a logic one and bits B1 through B5 logic zeroes (see FIGS. 1 and 2) the currents sourced to summing network 70 from transistors 118 through 128 are source to output 28 whereby I out is equal to the sum of the currents I1, I2, I3, I4, I5, I6, I7 while all of the five fine currents source via leads 72-180 are source to ground.

In between the two aforementioned binary input codes, each unit current segment level I1 through I7 is summed through the diode means of summing circuit 70 and remains on as the binary signal increases, for example, FIG. 4 shows the 32 steps on the binary coded input signal to switch the output current IOUT from a value equal to I1 to double that value by summing the current I2 with the latter. Thus, a binary input signal equal to a value of 00100000, i.e., bits B1 through B5 and B7 and B8 being equal to logic zeros with bit B6 a logical 1, the current from transistor 118 flows through diode 226 while all other currents are switched to ground through control logic circuit 82. This produces a current IOUT that is equal to I1. The current I1 is equal to one current segment unit. As the binary signal increases by one, i.e. equal to the binary code 001000001 the control logic circuit 82 will permit the current sourced from transistor 170, via lead 78, to be sourced to summing network 70 via diode 220 instead of being sourced to ground. This current is then summed with the current I1 at node 28. As the binary coded input signal sequentially steps through the values associated therewith as illustrated in FIG. 4, the current sources are alternately switched such that the binary weighted currents supplied via lead 72 and 80 are sequentially summed with the value of I1 through the respective diodes to produce a current IOUT which monotonically increases from the value of I1 to the value of I1 plus I2. Before I2 is switched to summing network 70 the binary input signal is equal to the value of 00111111 which allows all of the five fine or binary weighted currents to be summed through the respective diodes. Therefore, just prior to the input signal increasing from 00111111 to a code of 01000000, IOUT is equal to I1+(31/32) IREF which is one LSB below the value of I1+I2. Monoticity is assured because each fine current as well as is their sum is less than an individual current segment.

Figure 5:
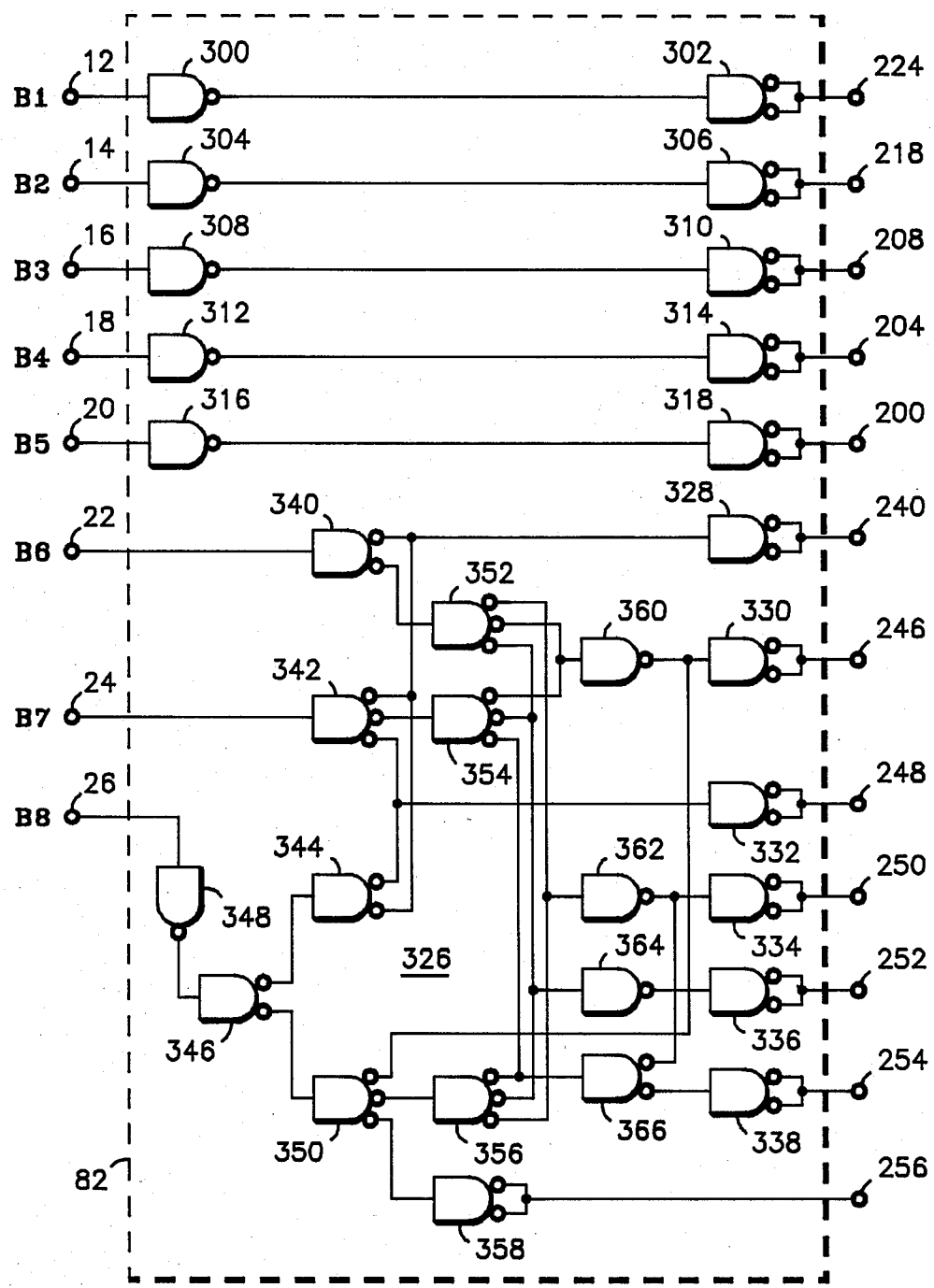
FIG. 5 is a block diagram illustrating the control logic decode circuit of the DAC of FIG. 1.

Turning now to FIG. 5, the logic diagram at control logic circuit 82 is illustrated. Control logic circuit 82 decodes the binary input code for switching selective currents supplied by current source means 42 to summing network 70. The five lower bits B1 through B5 of the digital input signal corresponding to the five fine related currents are supplied at input terminals 12 through 20 of control logic circuit 82. Each of these bits drive a respective pair of integrated injection logic ($I^2L$) gates which are serially coupled to respective nodes 224, 218, 208, 204 and 200. Each $I^2L$ gate 300 through 318 acts as an inverter. For example, if B1 is a logic zero, the output of gate 300 is a logic one which in turn produces a logic zero at the output of gate 302 (terminal 224). This means that the current source to node 224 from transistor 170 is sunk to ground through the logic gate. FIG. 6 shows the structure of gate 302 utilizing conventional $I^2L$ convention. Transistors 320 and 322 are NPN devices operated in an inverted mode as understood. With a logic one input signal applied to the base of transistor 320, the current from current source 324 is conducted through the former which renders transistor 322 nonconductive. If the collectors of transistor 322 are connected to node 224 for example, as this transistor is turned off, all of the current source from transistor 170 is then summed via diode 220 to lead 258. Similarly, a logic zero supplied to the base of transistor 320 renders transistor 322 conductive whereby all of the current sourced from transistor 170 flows to ground reference through the former transistor. All of the $I^2L$ logic gates of control logic 82 are similar in structure to that illustrated in FIG. 6.

Control logic circuit 82 also includes logic decoder section 326 comprised of a plurality of interconnected $I^2L$ gates 328 through 366 having multiple outputs which decode the three bits (B6, B7 and B8) of the binary input signal in order to switch the associated segment current units I1 through I7 to ground or to summing network 70 in a similar manner as described above. The respective outputs of gates 328 through 338 are connected to terminals 240, 246, 248, 250, 252, 254 and 256 between the collectors of transistors 118 through 128 and summing network 70. Hence, as each of these gates are turned on by a logic zero applied to the inputs thereof the current segments associated therewith are switched to ground, otherwise, the particular current segment is sourced to the summing network 70. For example, with bits B6, B7 and B8 all logic zeroes, the outputs of these gates are driven to a logic zero such that all of the current segments, I1 through I7, are sourced to ground. With this particular input bit code the outputs of gate 340 are high which in conjunction with the outputs of gates 342 and 344 being high will cause the outputs of gate 328 to go low. Likewise, the outputs of gate 346 are driven to a low state as the output of gate 348 is in the high level state. The outputs of gate 350 are therefore placed in a high state as this gate is connected to one output of gate 346. The outputs of gates 352 and 354, the inputs of which are connected to outputs of gates 340 and 342 respectively, will be low. Also, because the outputs of gates of 356 and 358 are low, due to their respective outputs being coupled to gate 350, the outputs of gates 360, 362, 364, and 366 are driven to a high logic state. Since the outputs of gate 350, coupled to the input of gate 330, as well as the output of gate 366 coupled to the input of 334 are both high, all of the outputs of gates 328 through 338 are low as previously mentioned. As the binary input signal increases each current segment I1 through I7 is then sequentially switched from ground to be sourced to summing network 70 until IOUT equals the sum thereof as the binary signal reaches the code 11100000. It is apparent that the operation described above ensures that DAC 10 is inherently monotonic.

Thus, what has been described above, is an improved low voltage, single power supply operated integrated DAC which requires no resistor trimming in which the operation thereof is inherently monotonic.

I claim:

1. An integrated digital-to-analog converter (DAC) circuit for producing an analog output signal that is representative of an applied digital input signal including current supply means for providing both a plurality of equal weighted and binary weighted currents and summing means coupled with the current supply means which is responsive to the applied digital signal for selectively summing the currents to an output of the DAC to produce the analog output signal, the improvement comprising:

the DAc including first and second power supply conductors and being operated from a single source of power supply coupled to said first and second power supply conductors;

the current supply means including a plurality of resistors the respective values of which need not be adjusted after said resistors are formed in the integrated circuit, and said current supply means further including transistor circuit means for sourcing a plurality of equal weighted currents of predetermined magnitude to respective outputs, predetermined ones of which are directly supplied to the summing means, said transistor circuit means including a plurality of transistors of a first conductivity type each having first, second and control electrodes, said control electrodes being coupled together and receiving a first bias potential, said first electrodes each being coupled to said first power supply conductor through selected ones of said resistors and said second electrodes each being coupled to a respective output of said transistor circuit means, and subtractor circuit means coupled with selected ones of said outputs of said transistor circuit means for sinking predetermined portions of the currents sourced at each of said selected outputs such that binary decremented excess currents are sourced to the output of the current supply means corresponding to the binary weighted currents, said subtractor circuit means including, (1) a plurality of differentially connected transistor pairs of a second conductivity type in which each transistor has first, second and control electrodes, said control electrodes being coupled together and receiving a second bias potential, said first electrodes of each transistor pair being coupled together and to said second power supply conductor by respective resistors of said resistors of the current supply means, one of said second electrodes of each transistor pair being coupled to a respective output of said transistor circuit means with other of said second electrode of said transistor pair being coupled to said first power supply conductor, and (2) a plurality of transistors of said first conductivity type each having first, second and control electrodes, said control electrodes being coupled together, said first electrodes being coupled to one of said electrodes of a selected one of said transistor pairs, said second electrode of the first one of said transistors being coupled to said second power supply conductor, said second electrode of the second one of said transistor being coupled to a selected output of the current supply means, and said second electrodes of two of said transistors being coupled to a second selected output of the current supply means, and current source means coupled to said control electrodes of said plurality of transistors of said subtractor circuit means; and said summing means includes (1) control logic circuit means responsive to the digital signal for selectively causing the equal weighted currents and the binary weighted currents to be either summed at the output of the summing means or sourced to said second power supply conductor accordingly, (2) a plurality of diode means each coupled between a respective output of said transistor circuit means and said output thereof, and said control logic circuit means having a plurality of outputs each coupled to a respective one of said outputs of the transistor circuit means and a plurality of inputs to which the digital input signal is supplied.

2. The DAC of claim 1 including reference amplifier means coupled with said transistor circuit means and said substractor circuit means for supplying said first and second bias potentials.

3. A circuit for converting a digital signal supplied thereto into a representative analog signal, comprising:

first and second power supply conductors at which a single source of operating potential is supplied therebetween;

current supply means for producing a plurality of currents of substantially equal magnitudes at respective outputs thereof;

subtractor circuit means coupled to selected ones of said outputs of said current supply means for subtracting predetermined amounts of said currents sourced thereto from said current supply means to produce decremented binary weighted currents therefrom;

summing circuit means coupled between said outputs of said current supply means, said subtractor circuit means and an output which is responsive to the digital signal for selectively summing said equal magnitude and binary weighted currents to said output to produce the representative analog signal, said summing circuit means including, (1) diode means coupled between said current supply means, said subtractor means and said output for summing the currents sourced thereto to said output to produce the analog signal, and (2) control circuit means coupled to said diode means which receives the digital signal for selectively sinking said equal weighted and said binary weighted currents in response to the digital signal whereby said representative analog signal is produced at said output terminal;

said current supply means including a plurality of transistors each having first, second and control electrodes, said control electrodes being coupled to a first circuit node at which is provided a first bias potential, said first electrodes being coupled to said first power supply conductor, said second electrodes of selected ones of said plurality of transistors being directly coupled to said diode means with said second electrodes of the remaining ones of said plurality of transistors being coupled to said subtractor circuit means, said plurality of transistors sourcing currents of predetermined and substantially equal magnitudes at said second electrodes thereof;

said subtractor circuit means including, (1) a plurality of transistor pairs each transistor of which having first, second and control electrodes, said first electrodes of each transistor pair being coupled to said second power supply conductor, said control electrodes being coupled to a second circuit node at which is provided a second bias potential, said second electrode of one transistor of each transistor pair being coupled to a respective second electrode of said remaining transistors of said plurality of transistors of said current supply means, said second electrode of the other one of said transistor of each transistor pair being coupled to said first power supply conductor, said second electrodes of said one transistor also being coupled to said diode means, and (2) circuit means coupled between said second electrode of said one transistor of one of said transistor pairs and said diode means for producing a pair of binary weighted currents from the current sourced thereto which binary pair of currents are then sourced to said diode means;

a reference amplifier for providing said first and second bias potentials; and each transistor pair sinking a predetermined portion of the current sourced thereto from said remaining ones of said transistors of said current supply means with excess currents being sourced to said diode means, said excess currents having decremented binary relationship to one another.

4. The circuit of claim 3 wherein said circuit means includes:

a plurality of transistors each having first, second and control electrodes, said first electrodes being coupled to said first electrode of said one transistor of said transistor pair which is coupled thereto, said second electrode of the first one of said plurality of transistors being coupled to said second power supply conductor, said second electrode of a second one of said plurality of transistors providing one of said binary weighted currents therefrom, said second electrodes of a pair of said plurality of transistors being interconnected to provide the other one of said pair of binary weighted currents from said circuit means; and current source means coupled to said control electrodes of said plurality of transistors for sinking bias current therefrom.

5. A single power supply digital to analog converter (DAC), comprising:

first and second power supply conductors to which a source of single polarity operating potential is applied;

current supply means coupled to said first power supply conductor for providing a plurality of equal segment currents at respective outputs;

subtractor circuit means coupled between selected outputs of said current supply means and said second power supply conductor for sinking portions of particular ones of said segment currents from said selected outputs to provide decremented binary weighted currents at said selected outputs of said current supply means; and summing circuit means responsive to an applied digital signal and being coupled between said outputs of said current supply means and an output of the DAC for selectively summing said decremented binary weighted currents and said segment currents to provide a representative analog signal at said output.

6. The DAC of claim 5 wherein said current supply means includes transistor circuit means comprising a plurality of equal valued resistors which need not be trimmed in value, said transistor circuit means being coupled between said first power supply conductor and said plurality of outputs for supply said segment currents.

7. The DAC of claim 6 wherein said summing means includes control logic circuit means responsive to the digital signal for selectively causing the equal weighted currents and the binary weighted currents to be either summed at the output of the summing means or sourced to said second power supply conductor accordingly.

8. The DAC of claim 7 wherein said transistor circuit means includes:

a plurality of transistors of a first conductivity type each having first, second and control electrodes, said control electrodes being coupled together and receiving a first bias potential, said first electrodes each being coupled to said first power supply conductor through selected ones of said resistors and said second electrodes each being coupled to a respective output of said transistor circuit means.

9. The DAC of claim 8 wherein said summing means includes:

a plurality of diode means each coupled between a respective output of said transistor circuit means and said output thereof; and said control logic circuit means having a plurality of outputs each coupled to a respective one of said outputs of the transistor circuit means and a plurality of inputs to which the digital input signal is supplied.

10. The DAC of claim 9 wherein said subtractor circuit means includes:

a plurality of differentially connected transistor pairs of a second conductivity type in which each transistor has first, second and control electrodes, said control electrodes being coupled together and receiving a second bias potential, said first electrodes of each transistor pair being coupled together and to said second power supply conductor by respective resistors of said resistors of the current supply means, one of said second electrodes of each transistor pair being coupled to a respective output of said transistor circuit means with other of said second electrode of said transistor pair being coupled to said first power supply conductor;

a plurality of transistors of said first conductivity type each having first, second and control electrodes, said control electrode being coupled together, said first electrodes being coupled to one of said electrodes of a selected one of said transistor pairs, said second electrode of the first one of said transistors being coupled to said second power supply conductor, said second electrode of the second one of said transistors being coupled to a selected output of the current supply means, and said second electrodes of two of said transistors being coupled to a second selected output of the current supply means; and current source means coupled to said control electrodes of said plurality of transistors of said subtractor circuit means.

11. An integrated single power supply circuit for converting a digital signal to a representative analog signal, comprising:

power supply means for providing a single polarity source of operating potential between first and second power supply conductors;

current supply means for providing a plurality of equal segment currents at respective outputs, said current supply means including a plurality of equal valued, parallel configured resistors the values of which need not be trimmed after said resistors are formed in the integrated circuit;

circuit means coupled to selective ones of said outputs of said current supply means for subtracting a predetermined portion of each segment current applied to said subtractor circuit means to provide a plurality of decremented binary weighted currents at said selected outputs of said current supply means, said subtracting circuit means and said current supply means being coupled across said first and second power supply conductors; and summing means responsive to the digital signal for providing the analog signal at an output of the circuit, said summing means being coupled to said plurality of outputs of said current supply means.

12. The circuit of claim 11 wherein said summing circuit means includes:

diode means coupled between said current supply means, said subtractor means and said output for summing the currents sourced thereto to said output to produce the analog signal; and control circuit means coupled to said diode means which receives the digital signal for selectively sinking said equal weighted and said binary weighted currents in response to the digital signal whereby said representative analog signal is produced at said output terminal.

13. The circuit of claim 12 wherein said current supply means includes a plurality of transistors each having first, second and control electrodes, said control electrodes being coupled to a first circuit node at which is provided a first bias potential, said first electrodes being coupled to said first power supply conductor, said second electrodes of selected ones of said plurality of transistors being directly coupled to said diode means with said second electrodes of the remaining ones of said plurality of transistors being coupled to said subtractor circuit means, said plurality of transistors sourcing currents of predetermined and substantially equal magnitudes at said second electrodes thereof.

14. The circuit of claim 13 wherein said subtractor circuit means includes:

a plurality of transistor pairs each transistor of which having first, second and control electrodes, said first electrodes of each transistor pair being coupled to said second power supply conductor, said control electrodes being coupled to a second circuit node at which is provided a second bias potential, said second electrode of one transistor of each transistor pair being coupled to a respective second electrode of said remaining transistors of said plurality of transistors of said current supply means, said second electrode of the other one of said transistor of each transistor pair being coupled to said first power supply conductor, said second electrodes of said one transistor also being coupled to said diode means; and circuit means coupled between said second electrode of said one transistor of one of said transistor pairs and said diode means for producing a pair of binary weighted currents from the current sourced thereto which binary pair of currents are then sourced to said diode means.

15. The circuit of claim 14 including:

a reference amplifier for providing said first and second bias potentials; and each transistor pair sinking a predetermined portion of the current sourced thereto from said remaining ones of said transistors of said current supply means with excess currents being sourced to said diode means, said excess currents having decremented binary relationship to one another.

* * * * *